(12) United States Patent
Sugimachi et al.

(10) Patent No.: US 10,229,869 B2
(45) Date of Patent: Mar. 12, 2019

(54) SEMICONDUCTOR DEVICE AND POWER CONVERSION DEVICE INCLUDING A BENT CONTROL SIDE FRAME

(71) Applicant: Mitsubishi Electric Corporation, Tokyo (JP)

(72) Inventors: Seiya Sugimachi, Tokyo (JP); Masataka Shiramizu, Tokyo (JP)

(73) Assignee: Mitsubishi Electric Corporation, Tokyo (JP)

( * ) Notice: Subject to any disclaimer, the term of this patent is extended or adjusted under 35 U.S.C. 154(b) by 0 days.

(21) Appl. No.: 15/691,068

(22) Filed: Aug. 30, 2017

(65) Prior Publication Data

US 2018/0158761 A1  Jun. 7, 2018

(30) Foreign Application Priority Data

Dec. 1, 2016  (JP) .................. 2016-234185

(51) Int. Cl.
| | |
|---|---|
| *H02K 11/30* | (2016.01) |
| *H01L 23/495* | (2006.01) |
| *H05K 7/18* | (2006.01) |
| *H02M 7/00* | (2006.01) |

(52) U.S. Cl.
CPC .. *H01L 23/49551* (2013.01); *H01L 23/49537* (2013.01); *H01L 23/49548* (2013.01); *H01L 23/49562* (2013.01); *H02K 11/30* (2016.01); *H05K 7/18* (2013.01); *H01L 23/49575* (2013.01); *H02M 7/003* (2013.01)

(58) Field of Classification Search
CPC .......... H05K 7/18; H05K 7/183; H02K 11/33; H02K 11/30
See application file for complete search history.

(56) References Cited

U.S. PATENT DOCUMENTS

| | | | | |
|---|---|---|---|---|
| 2002/0158315 A1* | 10/2002 | Karube | ................. | H01L 23/562 257/666 |
| 2006/0220180 A1* | 10/2006 | Takahashi | ............. | H01L 23/488 257/565 |
| 2014/0286067 A1* | 9/2014 | Ohnishi | ................ | H02M 7/003 363/131 |
| 2017/0025334 A1* | 1/2017 | Van Gemert | ....... | H01L 23/4334 |
| 2017/0092568 A1* | 3/2017 | Ikeda | .................... | H01L 25/071 |

FOREIGN PATENT DOCUMENTS

JP   2013-038105 A   2/2013

* cited by examiner

*Primary Examiner* — Gary L Laxton
*Assistant Examiner* — Peter Novak
(74) *Attorney, Agent, or Firm* — Studebaker & Brackett PC

(57) ABSTRACT

A semiconductor device has a configuration in which a high-side module portion and a low-side module portion overlap each other. The semiconductor device further includes a control-side frame extending across the high-side module portion and the low-side module portion, and having a high-side integrated circuit and a low-side integrated circuit placed thereon. The high-side integrated circuit of the high-side module portion and the low-side integrated circuit of the low-side module portion are placed on one main surface of the control-side frame. At a boundary between the high-side module portion and the low-side module portion, the control-side frame is bent such that the high-side semiconductor chip and the low-side semiconductor chip face each other.

12 Claims, 6 Drawing Sheets

SEMICONDUCTOR DEVICE AND POWER CONVERSION DEVICE INCLUDING A BENT CONTROL SIDE FRAME

BACKGROUND OF THE INVENTION

Field of the Invention

The present invention relates to a semiconductor device and a power conversion device, and particularly to a semiconductor device as an inverter module having a structure in which a high-side semiconductor element and a low-side semiconductor element face each other, and a power conversion device including the semiconductor device.

Description of the Background Art

With reduction in size of an inverter module, reduction in area of mounting on a substrate on the customer's premises has been strongly requested of the inverter module. In order to respond to such a request, a conventional inverter module has pursued reduction in size and increase in performance of a semiconductor chip to reduce the area of mounting on a substrate on the customer's premises. However, in the conventional inverter module, a switching element and a freewheeling diode are mounted on the same plane. Therefore, in a study of the module size, it is necessary to reduce the size of the semiconductor chip having the switching element and the like mounted thereon.

In order to obtain the properties equivalent to those of a non-miniaturized inverter module, an inverter module having a miniaturized semiconductor chip requires increase in performance of the semiconductor chip. However, it is difficult to make the performance of the miniaturized semiconductor chip better than the performance of the semiconductor chip prior to miniaturization. Therefore, there are limitations to reducing the substrate mounting area in the conventional inverter module using the above-described method.

Thus, Japanese Patent Laying-Open No. 2013-038105, for example, discloses the technique of reducing a substrate mounting area of an inverter module by stacking a low-side semiconductor chip including a low-side electrode on a high-side semiconductor chip including a high-side electrode. The low-side electrode and the high-side electrode in the inverter module driven by high power refer to electrodes that receive a low potential side and a high potential side of a DC voltage, respectively.

SUMMARY OF THE INVENTION

According to Japanese Patent Laying-Open No. 2013-038105 described above, the low-side semiconductor chip including the low-side electrode and the high-side semiconductor chip including the high-side electrode are connected with a middle-side electrode interposed therebetween. Therefore, there may arise a problem of increase in thickness of the inverter module as a whole by a thickness of the middle-side electrode.

The present invention has been made in view of the above-described problem and an object of the present invention is to provide a semiconductor device having a reduced overall size without increasing an overall thickness, and a power conversion device including the semiconductor device.

A semiconductor device of the present invention has a configuration in which a high-side module portion and a low-side module portion overlap each other. The semiconductor device further includes a control-side frame extending across the high-side module portion and the low-side module portion, and having a high-side integrated circuit and a low-side integrated circuit placed thereon. The high-side integrated circuit of the high-side module portion and the low-side integrated circuit of the low-side module portion are placed on one main surface of the control-side frame. At a boundary between the high-side module portion and the low-side module portion, the control-side frame is bent such that the high-side semiconductor chip and the low-side semiconductor chip face each other.

The foregoing and other objects, features, aspects and advantages of the present invention will become more apparent from the following detailed description of the present invention when taken in conjunction with the accompanying drawings.

DESCRIPTION OF THE PREFERRED EMBODIMENTS

Embodiments of the present invention will be described hereinafter with reference to the drawings.

First Embodiment

First, a configuration of an inverter module as a configuration of a semiconductor device according to a first example of the present embodiment will be described with reference to FIGS. 1 to 7. For convenience in description, an X direction, a Y direction and a Z direction are introduced in a part of the figures.

Figure 1:
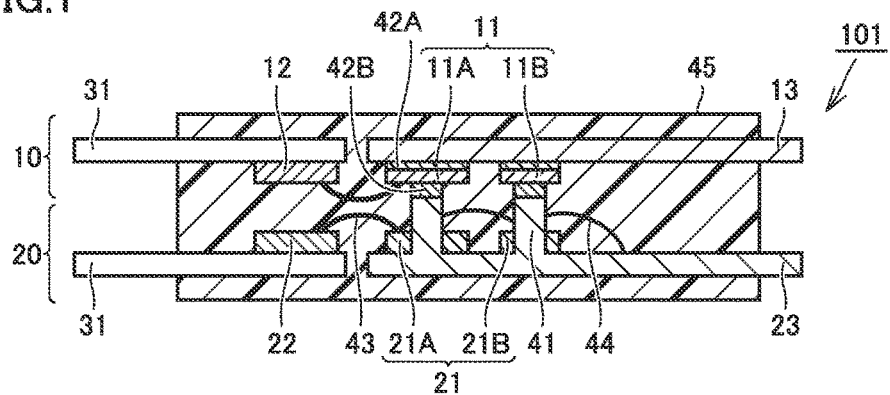
FIG. 1 is a schematic side view showing a configuration of an inverter module according to a first example of a first embodiment.
Figure 4:
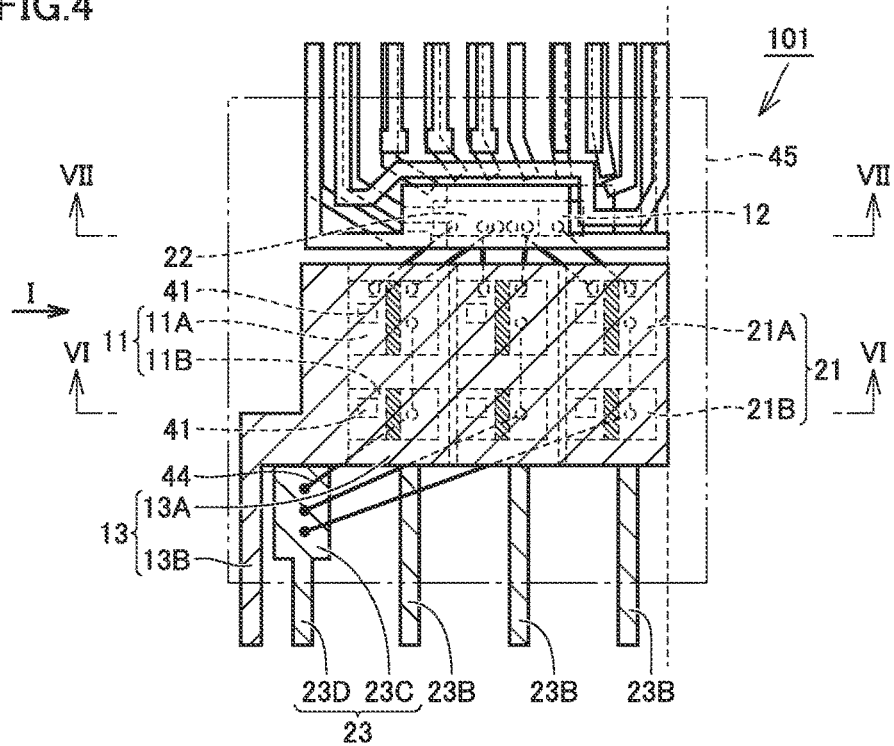
FIG. 4 is a schematic see-through plan view of the inverter module according to the first example of the first embodiment in FIG. 1 when viewed in a plan view.
Figure 5:
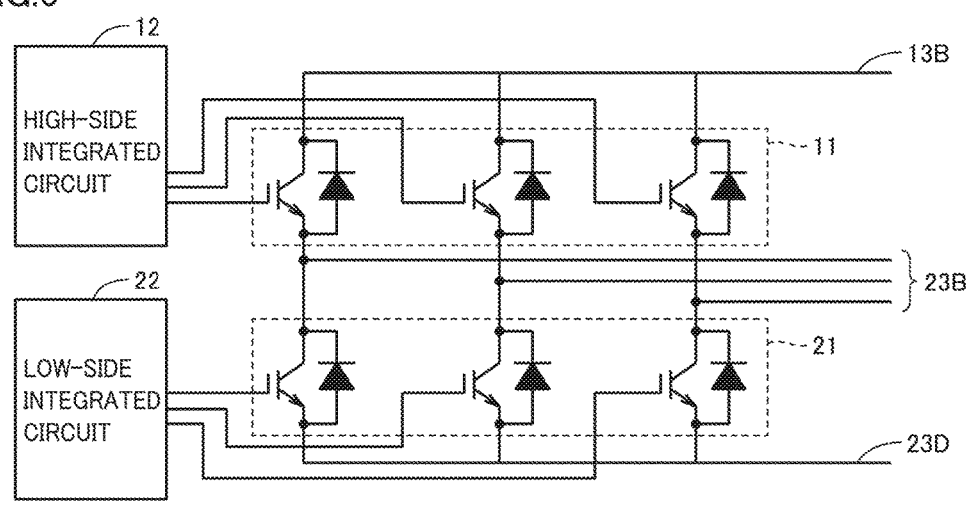
FIG. 5 is a circuit diagram of the inverter module in FIG. 4.

FIG. 1 is a side view (front view) showing an outer appearance when the inverter module according to the first example of the present embodiment is viewed from a direction I indicated by an arrow in FIG. 4. Referring to FIG. 1, an inverter module 101 according to the first example of the present embodiment includes a high-side module portion 10 and a low-side module portion 20. Inverter module 101 is, for example, a module that performs voltage conversion or power conversion of a DC voltage. High-side module portion 10 is a portion of inverter module 101 that serves as a high-side circuit configured to receive the high potential side of the DC voltage. Low-side module portion 20 is a portion of inverter module 101 that serves as a low-side circuit configured to receive the low potential side of the DC voltage.

High-side module portion 10 includes a high-side semiconductor chip 11, a high-side integrated circuit 12 and a high-side lead frame 13. Low-side module portion 20 includes a low-side semiconductor chip 21, a low-side integrated circuit 22 and a low-side lead frame 23.

High-side semiconductor chip 11 of high-side module portion 10 is a semiconductor chip to which the high potential side of the DC voltage is connected, and includes a switching element 11A and a freewheeling diode 11B. Switching element 11A is a semiconductor chip having MOSFET (Metal Oxide Semiconductor Field Effect Transistor) or IGBT (Insulated Gate Bipolar Transistor) mounted thereon, and freewheeling diode 11B is a semiconductor chip having the diode mounted thereon. Switching element 11A and freewheeling diode 11B are placed on one main surface of high-side lead frame 13. High-side lead frame 13 is a lead frame to which the high potential side of a DC current is connected, and has a function as an electrode of the high-side circuit.

Low-side semiconductor chip 21 of low-side module portion 20 is a semiconductor chip to which the low potential side of the DC voltage is connected, and includes a switching element 21A and a freewheeling diode 21B. Switching element 21A is a semiconductor chip having MOSFET or IGBT mounted thereon, and freewheeling diode 21B is a semiconductor chip having the diode or MOSFET mounted thereon. Switching element 21A and freewheeling diode 21B are placed on one main surface of low-side lead frame 23. A wire connection frame 23C and an n-side lead terminal 23D as the low-side lead frame are lead frames to which the low potential side of the DC current is connected, and has a function as an electrode of the low-side circuit.

High-side integrated circuit 12 is a semiconductor chip on which an integrated circuit for controlling high-side module portion 10 is mounted. Low-side integrated circuit 22 is a semiconductor chip on which an integrated circuit for controlling low-side module portion 20 is mounted. High-side integrated circuit 12 and low-side integrated circuit 22 are placed on control-side frame 31.

Figure 2:
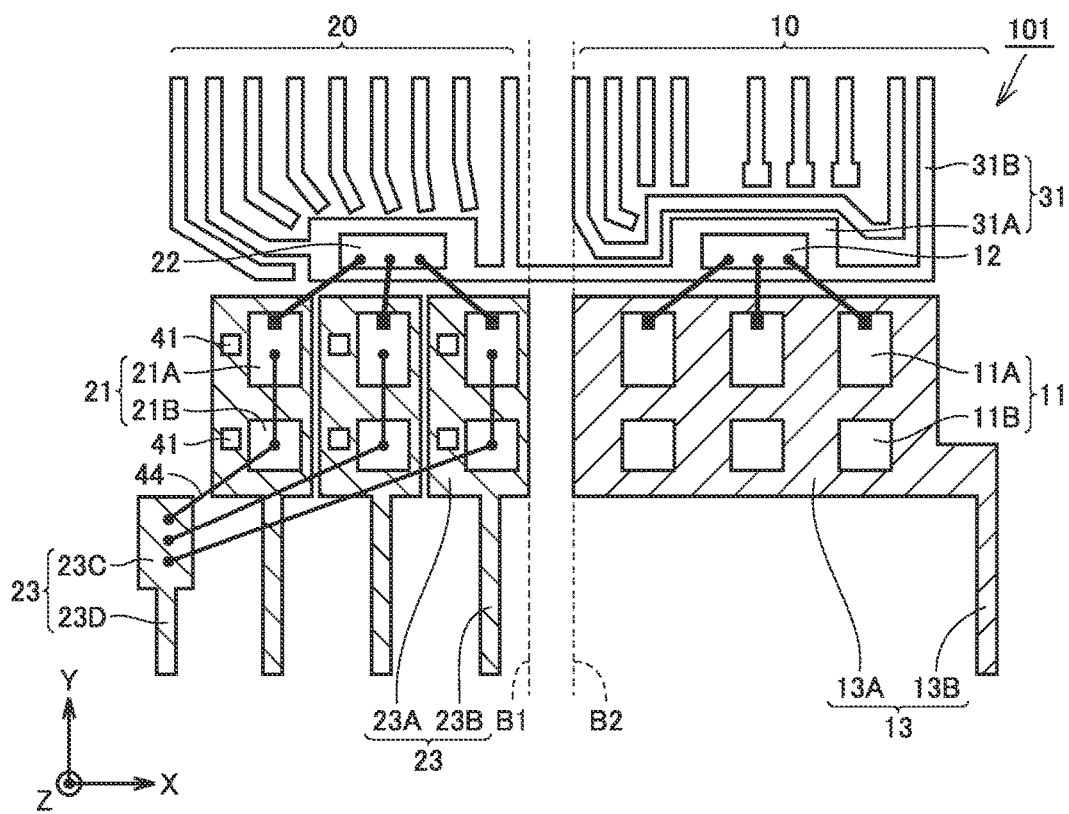
FIG. 2 is a schematic plan view showing a state of the inverter module according to the first example of the first embodiment before a frame is bent.
Figure 3:
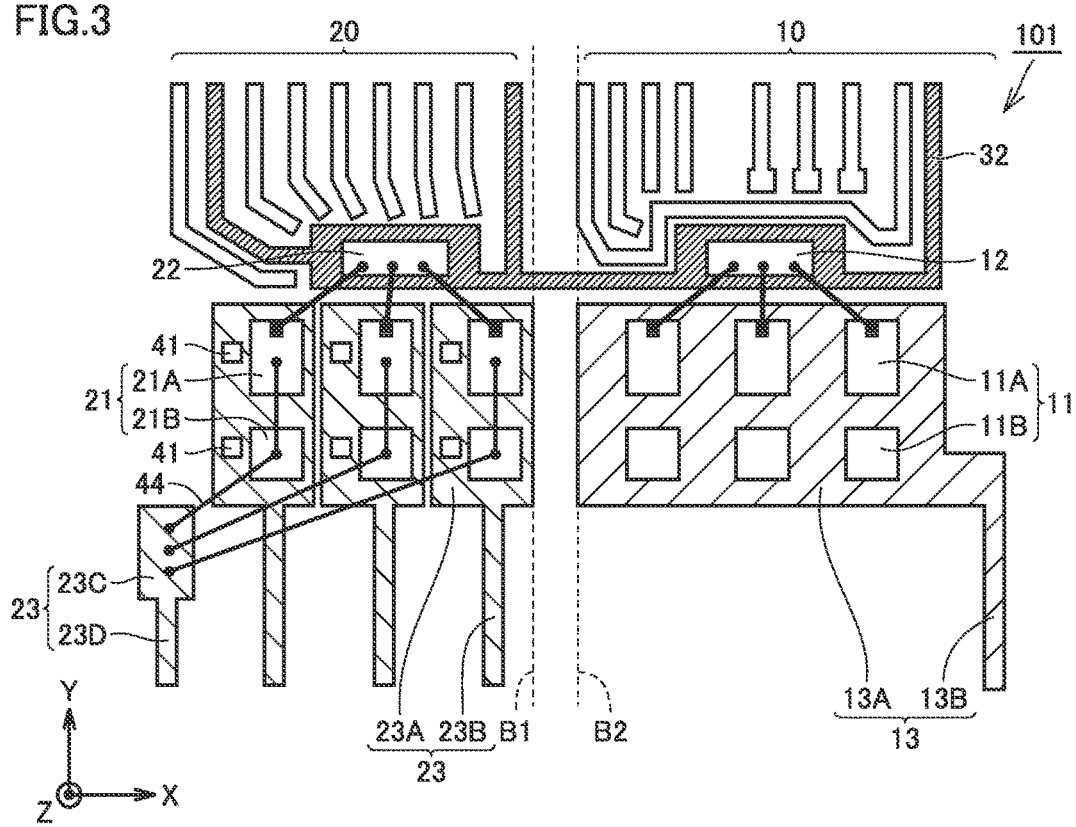
FIG. 3 is a schematic plan view showing a ground line included in the control-side frame in FIG. 2.

FIG. 1 shows a configuration in which high-side module portion 10 is superimposed on low-side module portion 20. Such a configuration is formed as described below. Referring to FIGS. 2 and 3, in inverter module 101 according to the first example of the present embodiment, high-side lead frame 13 arranged in high-side module portion 10 and low-side lead frame 23 arranged in low-side module portion 20 are separated from each other. However, these high-side lead frame 13 and low-side lead frame 23 may be originally formed as an integral member that may be separated in the manufacturing process. High-side lead frame 13 and low-side lead frame 23 are originally formed integrally using a frame member called "tie bar" that ties high-side lead frame 13 and low-side lead frame 23 on the outside thereof.

Although high-side module portion 10 is arranged on the positive side in the X direction with respect to low-side module portion 20 in FIG. 2, the present invention is not limited thereto. Conversely, low-side module portion 20 may be arranged on the positive side in the X direction.

Each of high-side lead frame 13 and low-side lead frame 23 is arranged such that the main surface thereof is along an X-Y plane. High-side lead frame 13 includes a power p-side frame 13A and a p-side lead terminal 13B extending therefrom. Since the switching element such as MOSFET driven by supply of a large current is used in high-side module portion 10 as a circuit including a high-side electrode, a terminal portion included in high-side lead frame 13 is defined herein as power p-side frame 13A and p-side lead terminal 13B. Power p-side frame 13A is, for example, a region extending in the rectangular shape, and three switching elements 11A and three freewheeling diodes 11B are, for example, spaced apart from one another and joined by die-bonding onto one main surface, i.e., onto a main surface on the positive side in the Z direction, of power p-side frame 13A in FIG. 2. Three rows of high-side semiconductor chips 11 aligned in the X direction have, for example, a UP phase, a VP phase and a WP phase in this order from the left side to the right side in FIG. 2, and a three-phase inverter can be thereby formed. By die-bond joining with a first joining material 42A, high-side lead frame 13 and high-side semiconductor chip 11 are electrically connected to each other. P-side lead terminal 13B is a terminal for electrically connecting high-side semiconductor chip 11 joined onto power p-side frame 13A to the outside of inverter module 101.

Similarly, low-side lead frame 23 includes a power n-side frame 23A and an n-side lead terminal 23B extending therefrom. Since the switching element such as MOSFET driven by supply of a large current is used in low-side module portion 20 as a circuit including a low-side electrode, a terminal portion included in low-side lead frame 23 is defined herein as power n-side frame 23A and n-side lead terminal 23B.

Three low-side lead frames 23 each including power n-side frame 23A and n-side lead terminal 23B are, for example, spaced apart from one another. Three rows of n-side lead terminals 23B and low-side semiconductor chips 21 have, for example, a UN phase, a VN phase and a WN phase in this order from the right side to the left side in FIG. 2, and a three-phase inverter can be thereby formed. Power n-side frame 23A included in each low-side lead frame 23 is, for example, a region extending in the rectangular shape, and one switching element 21A and one freewheeling diode 21B are, for example, spaced apart from each other and joined by die-bonding onto one main surface, i.e., onto a main surface on the positive side in the Z direction, of power n-side frame 23A in FIG. 2. By die-bond joining with the first joining material, low-side lead frame 23 and low-side semiconductor chip 21 are electrically connected to each other. N-side lead terminal 23B is a terminal for electrically connecting low-side semiconductor chip 21 joined onto power n-side frame 23A to the outside of inverter module 101.

Furthermore, as low-side lead frame 23, low-side lead frame 23 including wire connection frame 23C and n-side lead terminal 23D extending therefrom is provided. Low-side semiconductor chip 21 is connected by an aluminum wire 44 to low-side lead frame 23 including wire connection frame 23C and n-side lead terminal 23D.

Namely, in FIG. 2, three low-side lead frames 23 each including power n-side frame 23A and n-side lead terminal 23B as well as one low-side lead frame 23 including wire connection frame 23C and n-side lead terminal 23D are, for example, spaced apart from one another and aligned as low-side lead frames 23. These low-side lead frames 23, together with high-side lead frame 13, may be formed by separating an originally integral member formed using the tie bar and the like.

Although control-side frame 31 is, for example, arranged on the positive side in the Y direction with respect to the region where high-side lead frame 13 and low-side lead frames 23 are arranged in FIG. 2, the present invention is not limited thereto. Conversely, control-side frame 31 may be, for example, arranged on the negative side in the Y direction with respect to high-side lead frame 13.

Control-side frame 31 is arranged such that a main surface thereof is along the X-Y plane, and is arranged to extend across high-side module portion 10 and low-side module portion 20. Namely, single control-side frame 31 is provided to be arranged in both high-side module portion 10 and low-side module portion 20. Control-side frame 31 includes a control chip placement portion 31A and a control lead terminal 31B extending therefrom. Control chip placement portion 31A is, for example, a region extending in the rectangular shape, and two control chip placement portions 31A in total, i.e., one for high-side module portion 10 and one for low-side module portion 20, are formed, for example. High-side integrated circuit 12 is joined by die-bonding onto one main surface, i.e., onto a main surface on the positive side in the Z direction, of control chip placement portion 31A on the high-side module portion 10 side. Low-side integrated circuit 22 is joined by die-bonding onto one main surface, i.e., onto a main surface on the positive side in the Z direction, of control chip placement portion 31A on the low-side module portion 20 side. Control lead terminal 31B is a terminal for electrically connecting high-side integrated circuit 12 and low-side integrated circuit 22 joined onto control chip placement portions 31A to the outside of inverter module 101.

Since control-side frame 31 is arranged to extend across high-side module portion 10 and low-side module portion 20, control lead terminal 31B extends in the X direction to be continuous at a boundary between high-side module portion 10 and low-side module portion 20. Referring to FIG. 3, a ground line 32 can be defined as being formed by a portion where control-side frame 31 straddles the boundary between high-side module portion 10 and low-side module portion 20, and control chip placement portions 31A connected to this portion. This ground line 32 is a ground potential portion that is common to high-side module portion 10 and low-side module portion 20. Such ground line 32 is provided, and thus, a mounting area of inverter module 101 can be further reduced.

Referring again to FIGS. 1 and 2, high-side integrated circuit 12 and switching element 11A are electrically connected by a gold wire 43, i.e., a thin wire made of gold, and a gate wiring is thereby formed. Low-side integrated circuit 22 and switching element 21A are electrically connected by gold wire 43, i.e., a thin wire made of gold, and a gate wiring is thereby formed. Furthermore, switching element 21A and freewheeling diode 21B provided on each of three power n-side frames 23A in low-side module portion 20 are electrically connected by aluminum wire 44, i.e., a thin wire made of aluminum. Each of three freewheeling diodes 21B and wire connection frame 23C are electrically connected by aluminum wire 44. As described above, in inverter module 101, switching element 21A and freewheeling diode 21B as low-side semiconductor chip 21 are electrically connected by the bonding wire.

As shown in FIG. 2, a boundary line B1 and a boundary line B2 extending along the Y direction are, for example, provided at the boundary between high-side module portion 10 and low-side module portion 20. Along these boundary line B1 and boundary line B2, control-side frame 31 extending across, particularly, high-side module portion 10 and low-side module portion 20 of inverter module 101 is bent at substantially a right angle. Namely, a portion originally extending in the X direction, of a region sandwiched between boundary line B1 and boundary line B2 in FIG. 2, extends toward the positive side in the Z direction as a result of bending described above, and high-side module portion 10 is arranged to face low-side module portion 20 substantially in parallel, with high-side module portion 10 turned over as compared with FIG. 2.

As a result, referring to FIGS. 4 to 7, control-side frame 31 is bent such that high-side semiconductor chip 11 of high-side module portion 10 and low-side semiconductor chip 21 of low-side module portion 20 face each other in the Z direction.

Namely, in inverter module 101, high-side module portion 10 and low-side module portion 20 are arranged to overlap each other in a plan view. The reason why high-side semiconductor chip 11 and low-side semiconductor chip 21 face each other as a result of bending of control-side frame 31 as described above is that high-side semiconductor chip 11 and low-side semiconductor chip 21 are joined onto the main surfaces on the positive side in the Z direction of high-side lead frame 13 and low-side lead frame 23, respectively. High-side module portion 10 and low-side module portion 20 are both configured to extend in the horizontal direction along the X-Y plane and face each other. As a result, inverter module 101 has a horizontally-facing structure.

Similarly, as a result of bending of control-side frame 31 described above, high-side integrated circuit 12 and low-side integrated circuit 22 are also arranged to face each other in the Z direction. The reason why high-side integrated circuit 12 and low-side integrated circuit 22 face each other as a result of bending of control-side frame 31 as described above is that high-side integrated circuit 12 and low-side integrated circuit 22 are joined onto one main surfaces, i.e., onto the main surfaces on the positive side in the Z direction, of control chip placement portions 31A shown in FIG. 2, respectively.

Although high-side lead frame 13, low-side lead frame 23 and control-side frame 31 are separated as separate members in FIG. 2 and the like, these are integral using the tie bar at the time of bending of control-side frame 31 as described above. Therefore, as a result of bending of control-side frame 31, high-side lead frame 13 and low-side lead frame 23 are also arranged to be oriented to face each other. Specifically, high-side semiconductor chip 11, low-side semiconductor chip 21, high-side integrated circuit 12, and low-side integrated circuit 22 are first die-bonded onto the respective portions of the frame that is integral using the tie bar, and then, wire bonding by gold wire 43 and aluminum wire 44 is performed. Thereafter, the frame that is integral using the tie bar is bent along boundary line B1 and boundary line B2 in FIG. 2, such that high-side semiconductor chip 11 and low-side semiconductor chip 21 etc. face each other. Next, the tie bar of the frame is cut into high-side lead frame 13, low-side lead frame 23 and control-side frame 31.

Figure 6:
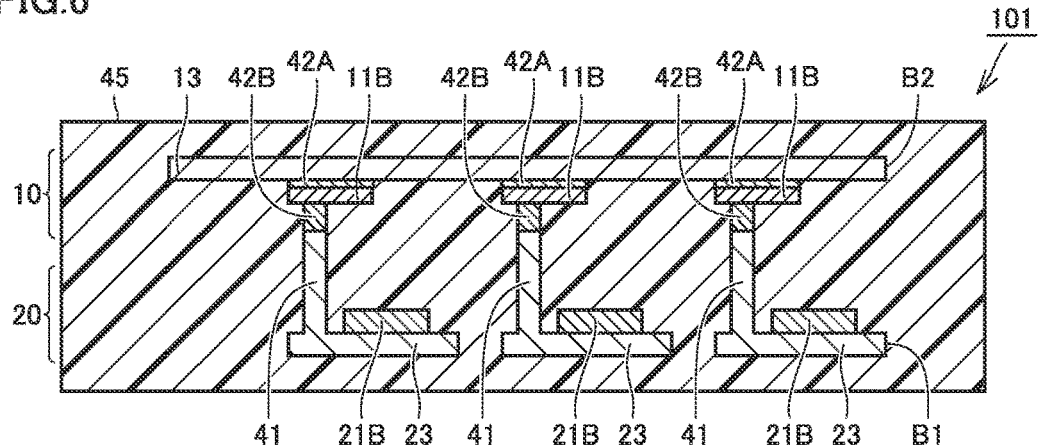
FIG. 6 is a schematic cross-sectional view of a portion taken along line VI-VI in FIG. 4.
Figure 7:
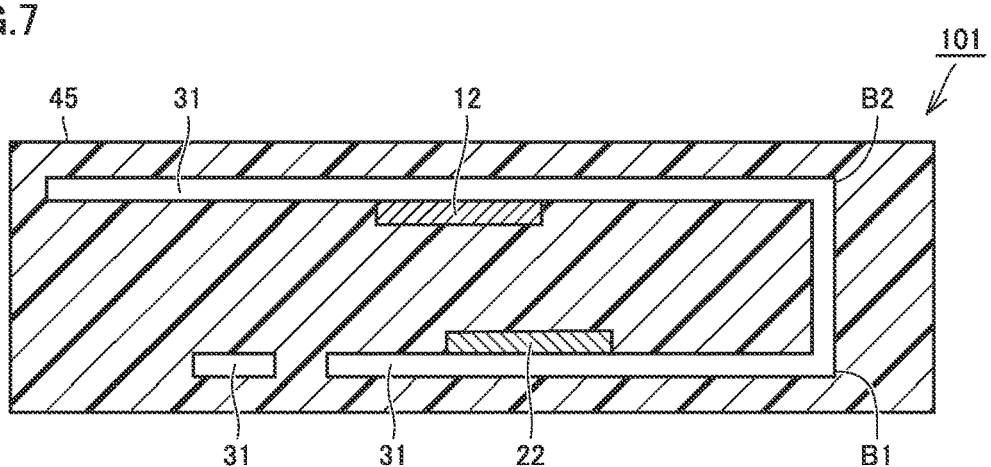
FIG. 7 is a schematic cross-sectional view of a portion taken along line VII-VII in FIG. 4.

As shown in FIGS. 4 and 6, it is preferable that switching element 11A of high-side module portion 10 and switching element 21A of low-side module portion 20 at least partially include an overlapping region in a plan view. It is also preferable that freewheeling diode 11B of high-side module portion 10 and freewheeling diode 21B of low-side module portion 20 at least partially include an overlapping region in a plan view. Furthermore, as shown in FIGS. 4 and 7, it is preferable that high-side integrated circuit 12 and low-side integrated circuit 22 at least partially overlap each other. Such a configuration makes it possible to reduce the area of inverter module 101 in a plan view and to reduce the mounting area on the customer's premises. Conversely, however, switching element 11A of high-side module portion 10 and switching element 21A of low-side module portion 20 may include no overlapping portion in a plan view. The same applies to freewheeling diode 11B and freewheeling diode 21B as well as high-side integrated circuit 12 and low-side integrated circuit 22.

A protruding portion 41 is formed, particularly, in a region adjacent to a region where switching element 21A is joined, on the main surface of power n-side frame 23A of low-side lead frame 23. Protruding portion 41 extends from low-side lead frame 23 and extends in the Z direction in FIG. 2, i.e., in the thickness direction of low-side lead frame 23. A tip of this protruding portion 41 overlaps in a plan view with and is electrically connected to a part of switching element 11A as high-side semiconductor chip 11 placed on power p-side frame 13A of high-side lead frame 13. In inverter module 101, protruding portion 41 is integral with low-side lead frame 23. Therefore, protruding portion 41 is electrically connected to low-side lead frame 23.

Similarly, protruding portion 41 is formed, particularly, in a region adjacent to a region where freewheeling diode 21B is joined, on the main surface of power n-side frame 23A. This protruding portion 41 is basically similar to protruding portion 41 described above, and a tip thereof overlaps in a plan view with and is electrically connected to a part of freewheeling diode 11B of high-side module portion 10. As described above, as shown in a circuit diagram in FIG. 5, high-side semiconductor chip 11 and low-side semiconductor chip 21 are both connected to n-side lead terminal 23B.

From the perspective described above, in FIGS. 4 to 7, switching element 11A and switching element 21A only partially overlap each other, and protruding portion 41 can be connected to switching element 11A in the other part, i.e., in the region where switching element 11A and switching element 21A do not overlap each other. Similarly, freewheeling diode 11B and freewheeling diode 21B only partially overlap each other, and protruding portion 41 can be connected to freewheeling diode 11B in the other part, i.e., in the region where freewheeling diode 11B and freewheeling diode 21B do not overlap each other.

However, the whole of switching element 11A and the whole of switching element 21A may completely overlap each other in a plan view. The same applies to freewheeling diode 11B and freewheeling diode 21B. In this case, a part of protruding portion 41 extends in the thickness direction of low-side lead frame 23, while a part of protruding portion 41 is bent to extend along the X-Y plane to a position where protruding portion 41 overlaps with switching element 11A or freewheeling diode 11B, and thus, protruding portion 41 reaches switching element 11A or freewheeling diode 11B. The whole of high-side integrated circuit 12 and the whole of low-side integrated circuit 22 may also completely overlap each other.

In addition, in FIGS. 4 to 7, protruding portion 41 extends from low-side lead frame 23 and is connected to high-side semiconductor chip 11 of high-side module portion 10.

As described above, in inverter module 101, six protruding portions 41 in total are provided in the regions adjacent to three switching elements 21A and in the regions adjacent to three freewheeling diodes 21B, on power n-side frame 23A of low-side module portion 20.

Referring again to FIGS. 1 and 6, freewheeling diode 11B and protruding portion 41 are joined by a second joining material 42B. The same applies to switching element 11A and protruding portion 41. As a result, high-side module portion 10 and low-side module portion 20 are electrically connected to each other. As described above, high-side semiconductor chip 11 (switching element 11A and freewheeling diode 11B) and high-side lead frame 13 are joined by first joining material 42A. A melting point of second joining material 42B is preferably lower than a melting point of first joining material 42A.

The respective members of inverter module 101 having the above-described configuration are sealed with a mold resin 45. Mold resin 45 seals high-side semiconductor chip 11, low-side semiconductor chip 21, high-side integrated circuit 12, and low-side integrated circuit 22. However, the partial regions on the tip side of p-side lead terminal 13B, n-side lead terminals 23B and 23D, and control lead terminal 31B are exposed from mold resin 45, and electrical connection to the outside of inverter module 101 is possible in these regions.

Next, the background art for the first example of the present embodiment will be described and then the function and effect of the first example of the present embodiment will be described.

The background art as a comparative example of the present invention is such that a high-side circuit and a low-side circuit overlap each other in an inverter module, thereby reducing the module size. However, when the high-side circuit and the low-side circuit are connected with a middle-side electrode interposed therebetween as in the comparative example, the thickness of the inverter module as a whole increases by the thickness of the middle-side electrode. This is contradictory to the reduction in module size, and can lead to, for example, reduction in heat dissipation from the upper-side circuit to the lower-side circuit due to the presence of the middle-side electrode.

In addition to the foregoing, the comparative example has the following problem. For example, in the case of forming the above-described configuration in which the high-side circuit and the low-side circuit overlap each other, it is necessary to die-bond a high-side semiconductor chip of the high-side circuit and a low-side semiconductor chip of the low-side circuit in different steps. Namely, after die-bonding of the high-side semiconductor chip, the middle-side electrode sandwiched between the low-side semiconductor chip and the high-side semiconductor chip at the time of joining the low-side semiconductor chip and the high-side semiconductor chip needs to be die-bonded onto the high-side semiconductor chip, and then, the low-side semiconductor chip needs to be further die-bonded onto the middle-side electrode. In this case, a bonding agent of a high-side electrode and the previously die-bonded high-side semiconductor chip is re-heated during die-bonding of the low-side semiconductor chip, which may cause a problem of increase in void fraction of the bonding agent and decrease in reliability thereof.

Furthermore, the inverter module has conventionally had difficulty in arranging p-side lead terminal 13B and n-side lead terminal 23D close to each other due to its structure, which may cause a problem that routing of the wiring and suppression of an inductance of the wiring become difficult at the time of mounting on a substrate on the customer's premises.

Thus, like inverter module 101 according to the first example of the present embodiment, at the boundary between high-side module portion 10 and low-side module portion 20, control-side frame 31 is bent such that high-side semiconductor chip 11 and low-side semiconductor chip 21 face each other. As a result, high-side semiconductor chip 11 and low-side semiconductor chip 21 have such a positional relationship that high-side semiconductor chip 11 and low-side semiconductor chip 21 overlap to face each other.

Such a configuration makes it possible to electrically connect high-side semiconductor chip 11 and low-side semiconductor chip 21 without interposing a middle-side electrode therebetween. Therefore, it is possible to keep the total thickness small, while having the configuration in which high-side semiconductor chip 11 and low-side semiconductor chip 21 overlap each other. Thus, the size of inverter module 101 as a whole can be reduced without increasing the thickness of inverter module 101 as a whole. As a result, reduction in heat dissipation between the members of inverter module 101 can be suppressed.

In addition, in the present embodiment, high-side integrated circuit 12 and low-side integrated circuit 22 are placed on one main surface, i.e., on the positive side that is the same side in the Z direction, of control-side frame 31. Similarly, high-side semiconductor chip 11 and low-side semiconductor chip 21 are also placed on one main surfaces, i.e., on the positive side that is the same side in the Z direction, of high-side lead frame 13 and low-side lead frame 23, respectively. That is to say, before bending of the frame along boundary lines B1 and B2, all of high-side semiconductor chip 11, low-side semiconductor chip 21, high-side integrated circuit 12, and low-side integrated circuit 22 are joined to the same side in the Z direction as shown in FIG. 2. Therefore, all of these can be simultaneously joined to the frame in one die-bonding step. Thus, the problem of re-heating of the bonding agent of the previously die-bonded portion during the subsequent die-bonding step can be eliminated, and increase in void fraction of the bonding agent and decrease in reliability thereof can be eliminated.

In addition, according to inverter module 101, as a result of bending of control-side frame 31, p-side lead terminal 13B as a high-side terminal included in high-side module portion 10 and n-side lead terminals 23B and 23D as low-side terminals included in low-side module portion 20 are, for example, arranged to be adjacent to each other. In this manner, high-side module portion 10 and low-side module portion 20 are mutually superimposed. Therefore, at the time of mounting of inverter module 101 on a substrate on the customer's premises, routing of the wiring connecting p-side lead terminal 13B and n-side lead terminals 23B and 23D can be further simplified and an inductance of the routed wiring can be reduced.

Next, in inverter module 101, protruding portion 41 that can be electrically connected to high-side semiconductor chip 11 extends from low-side lead frame 23. Due to the configuration in which high-side semiconductor chip 11 and low-side semiconductor chip 21 face each other, it is difficult to electrically connect high-side semiconductor chip 11 and low-side semiconductor chip 21 by a bonding wire. Thus, protruding portion 41 extending from low-side lead frame 23 is used to connect protruding portion 41 to high-side semiconductor chip 11, which makes it possible to electrically connect low-side lead frame 23 and high-side semiconductor chip 11. Since low-side semiconductor chip 21 is electrically joined onto the main surface of low-side lead frame 23 by the die-bonding step and the like, high-side semiconductor chip 11 and low-side semiconductor chip 21 can be electrically connected.

Since low-side lead frame 23 and protruding portion 41 are integral, protruding portion 41 can be easily formed, for example, by bending a part of low-side lead frame 23.

In addition to the foregoing, in inverter module 101, the melting point of second joining material 42B that joins high-side semiconductor chip 11 and protruding portion 41 is lower than the melting point of first joining material 42A that joins high-side semiconductor chip 11 and high-side lead frame 13. As a result, when high-side semiconductor chip 11 and high-side lead frame 13 are joined by first joining material 42A and then high-side semiconductor chip 11 and protruding portion 41 are joined by second joining material 42B, re-melting of first joining material 42A caused by heating during joining with second joining material 42B can be suppressed and decrease in reliability of the joined portion can be suppressed.

Next, a configuration of an inverter module as a configuration of a semiconductor device according to a second example of the present embodiment will be described with reference to FIG. 8.

Figure 8:
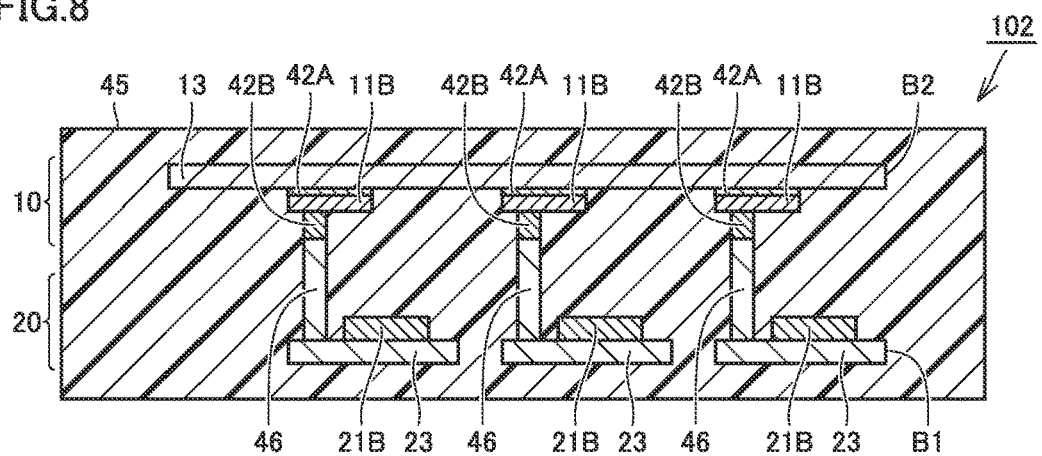
FIG. 8 is a schematic cross-sectional view similar to FIG. 6, for illustrating a configuration of an inverter module according to a second example of the first embodiment.

Referring to FIG. 8, in an inverter module 102 according to the second example of the present embodiment, a protruding portion 46 and low-side lead frame 23 are separate members. However, it is preferable that protruding portion 46 is made of the same material as that of low-side lead frame 23 and is joined to be electrically connected to low-side lead frame 23. Since other features of inverter module 102 are basically similar to those of inverter module 101, the same components are denoted by the same reference characters and description thereof will not be repeated.

Like inverter module 102, the inverter module may be configured such that protruding portion 46 which is a member separate from low-side lead frame 23 is joined to low-side lead frame 23. Such a configuration makes it possible to increase a degree of freedom in selecting a material of protruding portion 46.

Next, a configuration of an inverter module as a configuration of a semiconductor device according to a third example of the present embodiment will be described with reference to FIG. 9.

Figure 9:
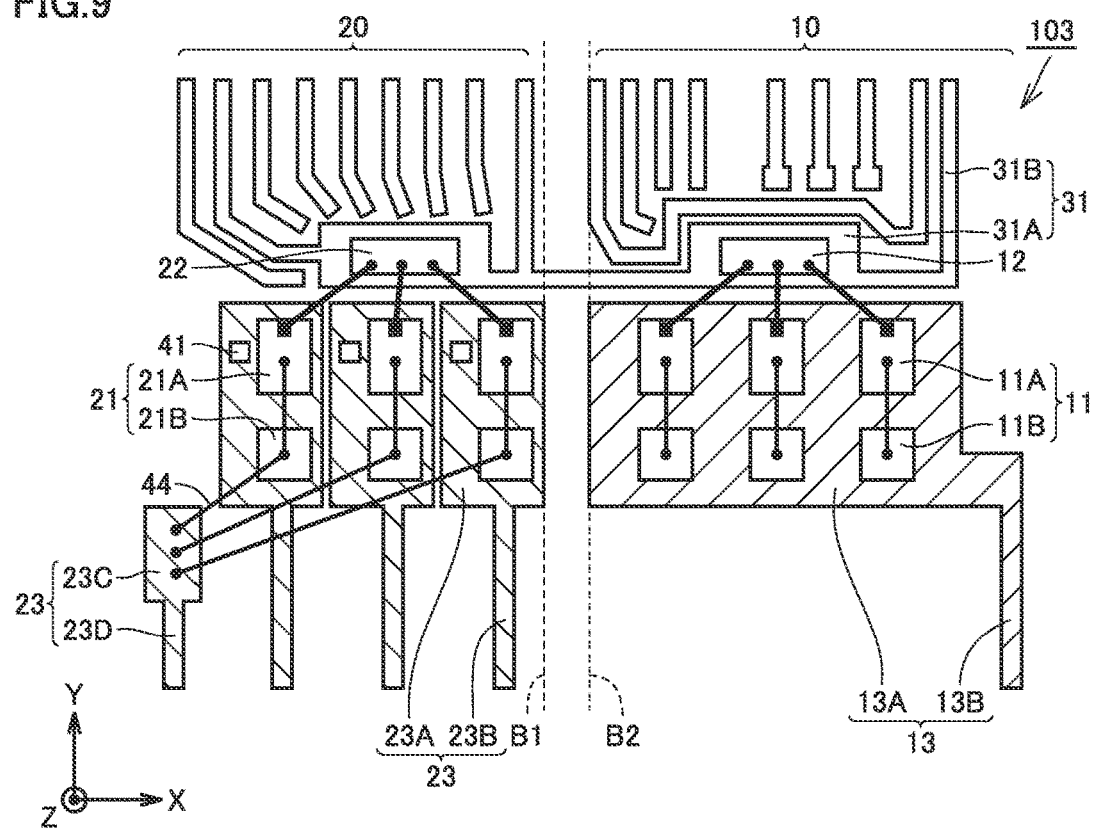
FIG. 9 is a schematic plan view similar to FIG. 2, for illustrating a configuration of an inverter module according to a third example of the first embodiment.

Referring to FIG. 9, similarly to inverter module 101, in an inverter module 103 according to the third example of the present embodiment, each of high-side semiconductor chip 11 and low-side semiconductor chip 21 has a switching element and a freewheeling diode. Namely, inverter module 103 has switching element 11A and freewheeling diode 11B as high-side semiconductor chip 11, and switching element 21A and freewheeling diode 21B as low-side semiconductor chip 21. Similarly to inverter module 101, switching element 21A and freewheeling diode 21B as low-side semiconductor chip 21 are bonded by aluminum wire 44, and freewheeling diode 21B and wire connection frame 23C are connected by aluminum wire 44 as a bonding wire.

In addition to the foregoing, however, in inverter module 103, switching element 11A and freewheeling diode 11B as high-side semiconductor chip 11 are connected by aluminum wire 44 as a bonding wire. In this respect, inverter module 103 is different from inverter module 101 in which switching element 11A and freewheeling diode 11B are not connected by aluminum wire 44.

Since other features of inverter module 103 are basically similar to those of inverter module 101, the same components are denoted by the same reference characters and description thereof will not be repeated.

As in inverter module 103, not only switching element 21A and freewheeling diode 21B of low-side module portion 20 but also switching element 11A and freewheeling diode 11B of high-side module portion 10 are connected by aluminum wire 44, and thus, the number of protruding portions 41 can be reduced. Specifically, six protruding portions 41 in total are provided in the regions adjacent to switching elements 21A and freewheeling diodes 21B in inverter module 101, whereas three protruding portions 41 in total are provided only in the regions adjacent to switching elements 21A in inverter module 103.

In inverter module 103, switching element 11A and freewheeling diode 11B are electrically connected by aluminum wire 44. Therefore, simply by joining and electrically connecting protruding portion 41 to switching element 11A, protruding portion 41, i.e., low-side lead frame 23 can be electrically connected to freewheeling diode 11B or switching element 11A. This is because switching element 11A and freewheeling diode 11B are electrically connected by aluminum wire 44. In this respect, inverter module 103 is different from inverter module 101 in which joining of freewheeling diode 11B and protruding portion 41 is needed because switching element 11A and freewheeling diode 11B are not wire-bonded.

Therefore, the number of protruding portions 41 in inverter module 103 can be made smaller than the number of protruding portions 41 in inverter module 101, and thus, ease of product assembly can be enhanced.

In FIG. 9, three protruding portions 41 in total are provided only in the regions adjacent to switching elements 21A. Conversely, three protruding portions 41 in total may be provided only in the regions adjacent to freewheeling diodes 21B.

Next, a configuration of an inverter module as a configuration of a semiconductor device according to a fourth example of the present embodiment will be described with reference to FIG. 10.

Figure 10:
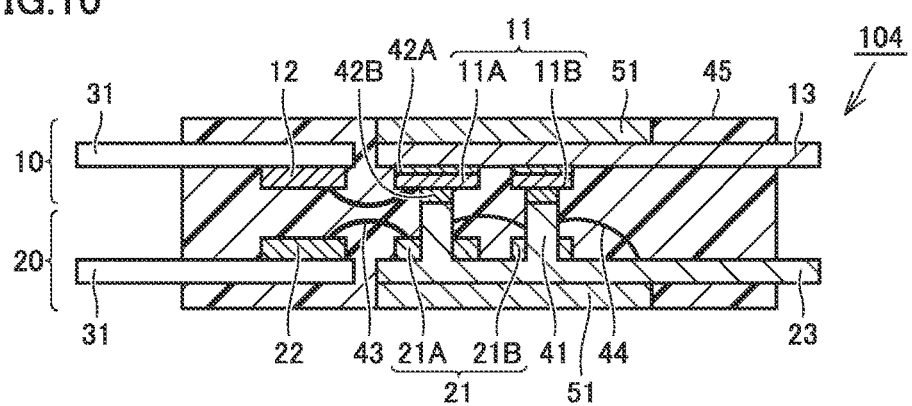
FIG. 10 is a schematic side view similar to FIG. 1, for illustrating a configuration of an inverter module according to a fourth example of the first embodiment.

Referring to FIG. 10, an inverter module 104 according to the fourth example of the present embodiment has a configuration basically similar to that of inverter module 101 in FIG. 1. However, in inverter module 104, a heat sink 51 is placed on a second main surface, i.e., an upper main surface in FIG. 10, of high-side lead frame 13 that is opposite to a first main surface, i.e., a lower main surface in FIG. 10, having high-side semiconductor chip 11 joined thereonto. In addition, in inverter module 104, heat sink 51 is also placed on a fourth main surface, i.e., a lower main surface in FIG. 10, of low-side lead frame 23 that is opposite to a third main surface, i.e., an upper main surface in FIG. 10, having low-side semiconductor chip 21 joined thereonto. Namely, heat sinks 51 are placed on the outside of high-side lead frame 13 and low-side lead frame 23, respectively, in the vertical direction of inverter module 104 as a whole with respect to the vertical direction in FIG. 10.

Since other features of inverter module 104 are basically similar to those of inverter module 101, the same components are denoted by the same reference characters and description thereof will not be repeated.

In each inverter module according to the present invention, the semiconductor chips such as switching elements 11A and 21A and freewheeling diodes 11B and 21B are arranged to face each other and concentrate in the inner region in the vertical direction of the inverter module as a whole. Therefore, the heat generated from the semiconductor chips is likely to be confined within the inverter module and is less likely to be released to outside the inverter module. Thus, it is concerned that the thermal resistance of the inverter module decreases.

Thus, in inverter module 104, heat sinks 51 are placed on the main surfaces of high-side lead frame 13 and low-side lead frame 23 facing the outside of inverter module 104 as a whole, respectively. With such a configuration, the heat emitted by each of high-side semiconductor chip 11 and low-side semiconductor chip 21 having a horizontally-facing structure can be released from heat sinks 51 to outside inverter module 104 with a high degree of efficiency.

A heat radiation fin is attached to each of the above-described second and fourth main surfaces as heat sink 51, and thus, decrease in thermal resistance of inverter module 104 can be suppressed.

Next, a configuration of an inverter module as a configuration of a semiconductor device according to a fifth example of the present embodiment will be described with reference to FIG. 11.

Figure 11:
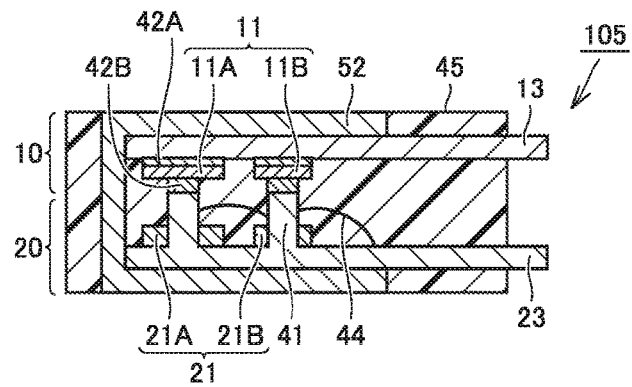
FIG. 11 is a schematic side view similar to FIG. 1, for illustrating a configuration of an inverter module according to a fifth example of the first embodiment.

Referring to FIG. 11, an inverter module 105 according to the fifth example of the present embodiment has a configuration basically similar to that of inverter module 104 in FIG. 10. However, in inverter module 105, a heat sink 52 on the above-described second main surface (upper main surface in FIG. 11) of high-side lead frame 13 and heat sink 52 on the above-described fourth main surface (lower main surface in FIG. 11) of low-side lead frame 23 are integrally joined. In this respect, inverter module 105 is different in configuration from inverter module 104 in which heat sink 51 on the above-described second main surface and heat sink 51 on the above-described fourth main surface are separately arranged.

That is to say, inverter module 105 further has a portion extending in the vertical direction in FIG. 11 and configured to connect heat sink 52 on the second main surface and heat sink 52 on the fourth main surface. Inside inverter module 105, this portion extending in the vertical direction is connected to be integral with the portion on the second main surface and the portion on the fourth main surface.

The configuration in which a plurality of portions of heat sink 52 are connected to be integral with each other inside inverter module 105 as described above produces the following function and effect. Specifically, the heat released from the semiconductor chips in both of high-side module portion 10 and low-side module portion 20 propagates through the portion of heat sink 52 extending in the vertical direction in FIG. 11 inside inverter module 105, and reaches the uppermost and lowermost portions of heat sink 52 in FIG. 11 with a high degree of efficiency. Therefore, simply by attaching a heat radiation fin to either the portion of heat sink 52 on the second main surface or the portion of heat sink 52 on the fourth main surface, the heat can be released with a high degree of efficiency.

From the perspective of more efficiently releasing the heat of switching element 21A and freewheeling diode 21B of low-side module portion 20 having a larger amount of heat generation, it is more preferable to provide the heat radiation fin only on the portion of heat sink 52 on the fourth main surface of low-side lead frame 23 in inverter module 105. In addition, it is more preferable to expose only the portion of heat sink 52 on the fourth main surface of low-side lead frame 23 from mold resin 45.

Second Embodiment

The present embodiment is an embodiment in which the inverter module as the semiconductor device according to any one of the first to fifth examples of the first embodiment described above is applied to a power conversion device. Although the present invention is not limited to a particular power conversion device, the case of applying the present invention to a three-phase inverter will be described below as a second embodiment.

Figure 12:
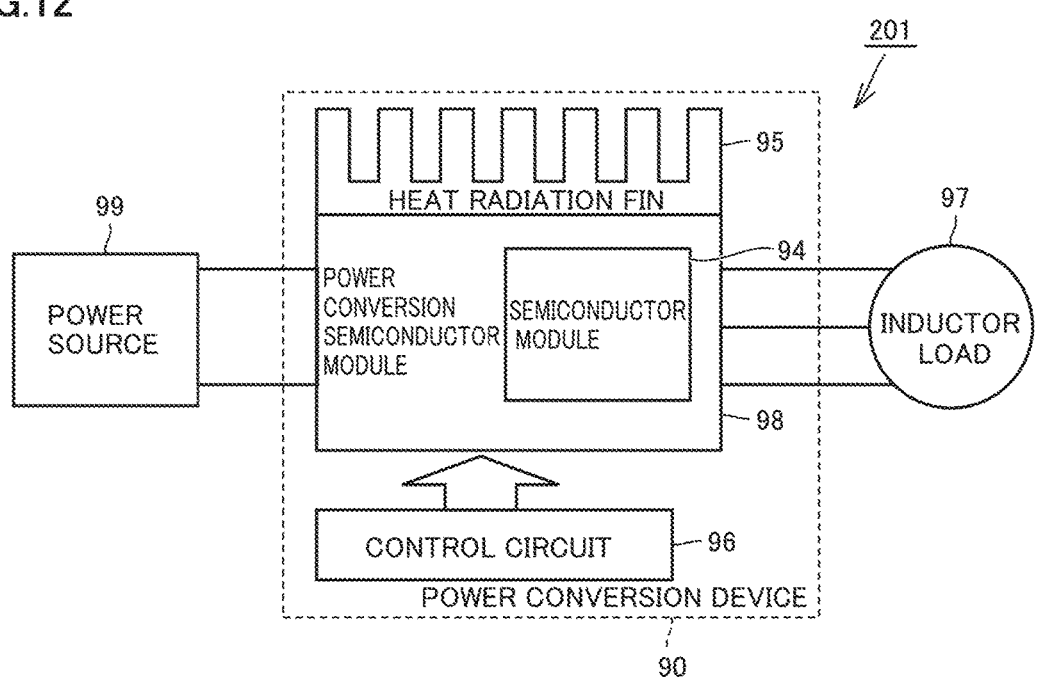
FIG. 12 is a block diagram showing a configuration of a power conversion system to which a power conversion device according to a second embodiment is applied.

Referring to FIG. 12, a power conversion system 201 as the power conversion device is formed by a power source 99, a power conversion device 90 and an inductive load 97. Power source 99 is a DC power source and supplies DC power to a power conversion semiconductor module 98. Power source 99 can be formed by various sources such as, for example, a DC system, a solar battery and a storage battery. Alternatively, power source 99 may be formed by a rectifying circuit or an AC/DC converter connected to an AC system. Alternatively, power source 99 may be formed by a DC/DC converter configured to convert DC power output from a DC system to predetermined power.

Power conversion device 90 is a three-phase inverter connected between power source 99 and inductive load 97. Power conversion device 90 converts the DC power supplied from power source 99 to AC power and supplies the AC power to inductive load 97. As shown in FIG. 12, power conversion device 90 includes power conversion semiconductor module 98, a control circuit 96 and a heat radiation fin 95. More specifically, power conversion device 90 includes power conversion semiconductor module 98 as a main conversion circuit configured to convert the DC power to the AC power and output the AC power to inductive load 97, and control circuit 96 configured to output a control signal for controlling power conversion semiconductor module 98 to power conversion semiconductor module 98.

Inductive load 97 is a three-phase motor driven by the AC power supplied from power conversion semiconductor module 98. Inductive load 97 is not limited to a particular application and is a motor mounted on various types of electrical equipment. Inductive load 97 is used as a motor designed for any one of a hybrid vehicle, an electric vehicle, a railroad vehicle, an elevator, and an air conditioner, for example.

Power conversion device 90 will be described in detail below. Power conversion semiconductor module 98 includes a switching element, a freewheeling diode, and a control integrated circuit configured to control the switching element and the freewheeling diode. The switching element is switched, and the DC power supplied from power source 99 is thereby converted to the AC power, which is supplied to inductive load 97. Although various specific circuit configurations of power conversion semiconductor module 98 are conceivable, power conversion semiconductor module 98 according to the present embodiment is a two-level three-phase full-bridge circuit and can be formed by six switching elements and six freewheeling diodes connected in antiparallel to the switching elements, respectively. Each two of the six switching elements are connected serially to form upper and lower arms, i.e., high-side module portion 10 and low-side module portion 20 described above. The upper and lower arms form each phase, i.e., a U phase, a V phase and a W phase of the full-bridge circuit. Output terminals of the upper and lower arms, i.e., three output terminals of power conversion semiconductor module 98 are connected to inductive load 97.

Power conversion semiconductor module 98 including the six switching elements and the six freewheeling diodes is formed by a semiconductor module 94 corresponding to any one of inverter modules 101 to 105 according to the respective examples of the first embodiment described above.

The control integrated circuit (corresponding to high-side integrated circuit 12 and low-side integrated circuit 22 described above) embedded in power conversion semiconductor module 98 generates a drive signal for driving each switching element also embedded in power conversion semiconductor module 98. Specifically, in accordance with a below-described control signal provided from control circuit 96, the control integrated circuit outputs a drive signal for turning on each switching element and a drive signal for turning off each switching element to a control electrode of each switching element. When the switching element is maintained in the ON state, the drive signal is a voltage signal (ON signal) having a voltage equal to or higher than a threshold voltage of the switching element. When the switching element is maintained in the OFF state, the drive signal is a voltage signal (OFF signal) having a voltage equal to or lower than the threshold voltage of the switching element.

Control circuit 96 controls the semiconductor chips of power conversion semiconductor module 98 such that the desired power is supplied to inductive load 97. Specifically, based on the power to be supplied to inductive load 97, control circuit 96 calculates the time (ON time) during which each semiconductor chip of power conversion semiconductor module 98 should be turned on. For example, control circuit 96 can control power conversion semiconductor module 98 through PWM control for modulating the ON time of each semiconductor chip in accordance with the voltage to be output. Then, control circuit 96 outputs the control instruction, i.e., the control signal to the control integrated circuit embedded in power conversion semiconductor module 98. This is for allowing output of the ON signal to the semiconductor chip to be turned on and output of the OFF signal to the semiconductor chip to be turned off at each point in time. In accordance with this control signal, the control integrated circuit outputs the ON signal or the OFF signal to the control electrode of each semiconductor chip as the drive signal.

Heat radiation fin 95 releases the heat generated by driving of power conversion semiconductor module 98 to the outside. Specifically, a joining grease is applied between heat radiation fin 95 and power conversion semiconductor module 98, and heat conduction of heat radiation fin 95 and the joining grease is used to release the heat generated by power conversion semiconductor module 98 to the outside. Heat radiation fin 95 may be attached to only one of a plurality of side surfaces forming power conversion semiconductor module 98, or heat radiation fins 95 may be attached to two facing side surfaces of a plurality of side surfaces forming power conversion semiconductor module 98.

In power conversion system 201 as the power conversion device according to the present embodiment, power conversion semiconductor module 98 is formed by semiconductor module 94 corresponding to any one of inverter modules 101 to 105 according to the respective examples of the first embodiment described above. Therefore, reduction in size and increase in reliability of power conversion system 201 can be achieved.

Although the example of applying the present invention to the two-level three-phase inverter has been described in the present embodiment, the present invention is not limited thereto and is applicable to various power conversion devices. Although the two-level power conversion device has been used in the present embodiment, a three-level or multilevel power conversion device may be used. Alternatively, the present invention may be applied to a single-phase inverter in the case of supplying the electric power to a single-phase load. Alternatively, the present invention can also be applied to a DC/DC converter or an AC/DC converter in the case of supplying the electric power to a DC load and the like.

In addition, the power conversion device to which the present invention is applied is not limited to the above-described case of the load being a motor, and can be used as a power source device designed for any one of an electrical discharge processing machine, a laser processing machine, an induction heating cooker, and a contactless power feeding system, for example. Furthermore, the power conversion device to which the present invention is applied can also be used as a power conditioner for a solar power generation system, a power storage system or the like.

The features described in the embodiments (examples included in the embodiments) mentioned above may be combined and applied appropriately within the range where technical inconsistency does not occur.

Although the embodiments of the present invention have been described, it should be understood that the embodiments disclosed herein are illustrative and not limitative in any respect. The scope of the present invention is defined by the terms of the claims, and is intended to include any modifications within the scope and meaning equivalent to the terms of the claims.

What is claimed is:

1. A semiconductor device comprising a high-side module portion and a low-side module portion arranged to overlap each other in a plan view,
    the high-side module portion including a high-side semiconductor chip, a high-side integrated circuit, and a high-side lead frame having the high-side semiconductor chip placed thereon,
    the low-side module portion including a low-side semiconductor chip, a low-side integrated circuit, and a low-side lead frame having the low-side semiconductor chip placed thereon,
    the semiconductor device further comprising a control-side frame extending across the high-side module portion and the low-side module portion, and having the high-side integrated circuit and the low-side integrated circuit placed thereon,
    the high-side integrated circuit and the low-side integrated circuit being placed on one main surface of the control-side frame,
    the high-side lead frame having a first plurality of faces having at least one largest face,
    the low-side lead frame having a second plurality of faces having at least one largest face,
    at a boundary between the high-side module portion and the low-side module portion, the control-side frame being bent such that a largest face of the first plurality of faces and a largest face of the second plurality of faces face each other.

2. The semiconductor device according to claim 1, wherein
    a protruding portion is positioned to extend from the low-side lead frame in a thickness direction of the low-side lead frame and is electrically connectable to the high-side semiconductor chip placed on the high-side lead frame.

3. The semiconductor device according to claim 2, wherein
    the low-side lead frame and the protruding portion are integral.

4. The semiconductor device according to claim 2, wherein
    the low-side lead frame and the protruding portion are separate members.

5. The semiconductor device according to claim 2, wherein
    the high-side semiconductor chip and the high-side lead frame are joined by a first joining material,
    the high-side semiconductor chip and the protruding portion are joined by a second joining material, and
    a melting point of the second joining material is lower than a melting point of the first joining material.

6. The semiconductor device according to claim 1, wherein
    heat sinks are placed on a second main surface opposite to a first main surface having the high-side semiconductor chip of the high-side lead frame joined thereonto, and on a fourth main surface opposite to a third main surface having the low-side semiconductor chip of the low-side lead frame joined thereonto.

7. The semiconductor device according to claim 6, wherein
    the heat sink on the second main surface and the heat sink on the fourth main surface are joined integrally.

8. The semiconductor device according to claim 1, wherein
    each of the high-side semiconductor chip and the low-side semiconductor chip has a switching element and a freewheeling diode,
    the switching element and the freewheeling diode as the high-side semiconductor chip are connected by a bonding wire, and
    the switching element and the freewheeling diode as the low-side semiconductor chip are connected by the bonding wire.

9. The semiconductor device according to claim 1, wherein
    the high-side module portion includes a high-side terminal,
    the low-side module portion includes a low-side terminal, and
    the high-side terminal and the low-side terminal are arranged to be adjacent to each other.

10. A power conversion device comprising:
    a main conversion circuit having the semiconductor device as recited in claim 1, and configured to convert input electric power and output the electric power; and
    a control circuit configured to output a control signal for controlling the main conversion circuit to the main conversion circuit.

11. The semiconductor device according to claim 1, wherein the control-side frame forms a U-shape from a planar view.

12. The semiconductor device according to claim 1, wherein the control-side frame is arranged not to overlap with the high-side lead frame and the low-side lead frame in a plan review.

* * * * *